(12) United States Patent
Sarti

(10) Patent No.: US 9,622,373 B1
(45) Date of Patent: Apr. 11, 2017

(54) HIGH VOLTAGE DIRECT CURRENT POWER SYSTEM FOR DATA CENTERS

(71) Applicant: Facebook, Inc., Menlo Park, CA (US)

(72) Inventor: Pierluigi Sarti, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 1 day.

(21) Appl. No.: 14/941,005

(22) Filed: Nov. 13, 2015

(51) Int. Cl.
| | |
|---|---|
| *H05K 7/14* | (2006.01) |
| *H02M 3/04* | (2006.01) |
| *H05K 7/20* | (2006.01) |
| *H02M 1/42* | (2007.01) |
| *H02M 7/04* | (2006.01) |

(52) U.S. Cl.
CPC ............ *H05K 7/1492* (2013.01); *H02M 1/42* (2013.01); *H02M 3/04* (2013.01); *H02M 7/04* (2013.01); *H05K 7/20736* (2013.01)

(58) Field of Classification Search
CPC ... H05K 7/1492; H05K 7/20736; H02M 7/04; H02M 3/04; H02M 1/42
USPC ............ 361/601, 622–624, 675–678, 679.02
See application file for complete search history.

(56) References Cited

U.S. PATENT DOCUMENTS

| | | | |
|---|---|---|---|
| 6,295,215 B1 | 9/2001 | Faria et al. | |
| 7,892,108 B2 | 2/2011 | Kuo | |
| 7,974,796 B2 * | 7/2011 | Tamai | ................... G01R 31/361 |
| | | | 702/63 |
| 9,110,107 B2 * | 8/2015 | Busca | .................... H02H 3/087 |
| 9,148,068 B2 | 9/2015 | Sarti et al. | |
| 9,320,166 B1 * | 4/2016 | Marr | ......................... H05K 7/14 |
| 9,552,031 B2 | 1/2017 | Sarti et al. | |
| 2003/0197428 A1 * | 10/2003 | Hatton | ..................... H02J 9/062 |
| | | | 307/82 |
| 2005/0146223 A1 * | 7/2005 | Kanouda | .................... G06F 1/30 |
| | | | 307/66 |
| 2005/0162830 A1 * | 7/2005 | Wortman | ............ H05K 7/20572 |
| | | | 361/695 |
| 2009/0164820 A1 * | 6/2009 | Abraham | ................... G06F 1/30 |
| | | | 713/323 |
| 2011/0057724 A1 * | 3/2011 | Pabon | .................... H02M 7/219 |
| | | | 327/581 |
| 2012/0013186 A1 * | 1/2012 | Sarti | ......................... G06F 1/30 |
| | | | 307/23 |

(Continued)

OTHER PUBLICATIONS

Choi, et al.: "New 24-Pulse Diode Rectifier Systems for Utility Interface of High-Power AC Motor Drives." IEEE Transactions on Industry Applications, vol. 33, No. 2, Mar./Apr. 1997, 11 pages.

(Continued)

*Primary Examiner* — Anthony Haughton
*Assistant Examiner* — Yahya Ahmad
(74) *Attorney, Agent, or Firm* — Perkins Coie LLP

(57) ABSTRACT

Several embodiments include a server rack that accesses high voltage direct current (HVDC) power from a power source external to the server rack. The server rack can provide the HVDC power to two or more shelves in the server rack via at least a HVDC power rail pair. One or more DC-DC converters in a shelf of server rack can convert the HVDC power to a lower DC voltage usable by information technology (IT) load in the shelf. A power distribution board (e.g., in the shelf or in the server rack) can then provide the lower DC voltage to the IT load. The DC-DC converters can be blindly mated with the power distribution board and can be hot swappable from the power distribution board.

20 Claims, 7 Drawing Sheets

(56) References Cited

U.S. PATENT DOCUMENTS

| | | | | |
|---|---|---|---|---|
| 2012/0153720 | A1* | 6/2012 | Chang | H02J 7/34 |
| | | | | 307/23 |
| 2013/0154365 | A1* | 6/2013 | Sarti | H02M 7/06 |
| | | | | 307/23 |
| 2013/0227309 | A1 | 8/2013 | Jau et al. | |
| 2015/0177808 | A1* | 6/2015 | Sarti | G06F 1/30 |
| | | | | 713/300 |
| 2015/0180233 | A1 | 6/2015 | Yamada et al. | |
| 2015/0245531 | A1* | 8/2015 | Meinecke | H02M 3/158 |
| | | | | 361/679.02 |

OTHER PUBLICATIONS

Non-Final Office Action mailed Jun. 10, 2016, for U.S. Appl. No. 14/251,174 by Sarti. et al., filed Apr. 11, 2014.
Restriction Requirement Mailed Apr. 7, 2016 of U.S. Appl. No. 14/251,174 by Sarti, P., filed Apr. 11, 2014.
U.S. Appl. No. 15/153,348 of Sarti, P., et al., filed May 12, 2016.
Notice of Allowance mailed Jun. 23, 2015, for U.S. Appl. No. 13/693,530 of Sarti, P. filed Dec. 4, 2012.
U.S. Appl. No. 15/377,957 by Sarti, P., filed Dec. 13, 2016.
U.S. Appl. No. 13/693,530 of Sarti, P. filed Dec. 4, 2012.
U.S. Appl. No. 14/251,174 of Sarti, P. filed Apr. 11, 2014.
U.S. Appl. No. 14/853,526 of Ebrahimzadeh, S. filed Sep. 14, 2015.
U.S. Appl. No. 14/873,585 of Sarti, P. filed Oct. 2, 2015.
U.S. Appl. No. 14/958,648 of Sarti, P. filed Dec. 3, 2015.

* cited by examiner

HIGH VOLTAGE DIRECT CURRENT POWER SYSTEM FOR DATA CENTERS

BACKGROUND

A data center is a practical solution for cloud computing, large-scale application services, or data services in information technology (IT) operations. One of the challenges of a data center is to provide uninterrupted power to computer server racks in the data center. Traditionally, a data center is connected to an alternating current (AC) grid. A server rack in the traditional data center converts the AC power to IT-usable direct current (DC) power via power supply modules. To ensure redundancy, the server rack includes multiple power supply modules in multiple power shelves in the server rack. The server rack can also include battery backup units (BBUs) that provide backup power when the power supply modules fail or when the AC grid experiences an outage or failure. The BBUs are often times placed in the power shelves as well. The power supply modules and the BBUs are heavy components that are difficult to maintain. The power supply modules and the BBUs generally last longer than computing servers in a server rack, but eventually need to be replaced and doing so is expensive. The bulky power shelves in the server rack can take up scarce real estate in the server rack and often have a low power distribution efficiency that makes the power consumption by the computing devices in the server rack costly.

Figure 1:
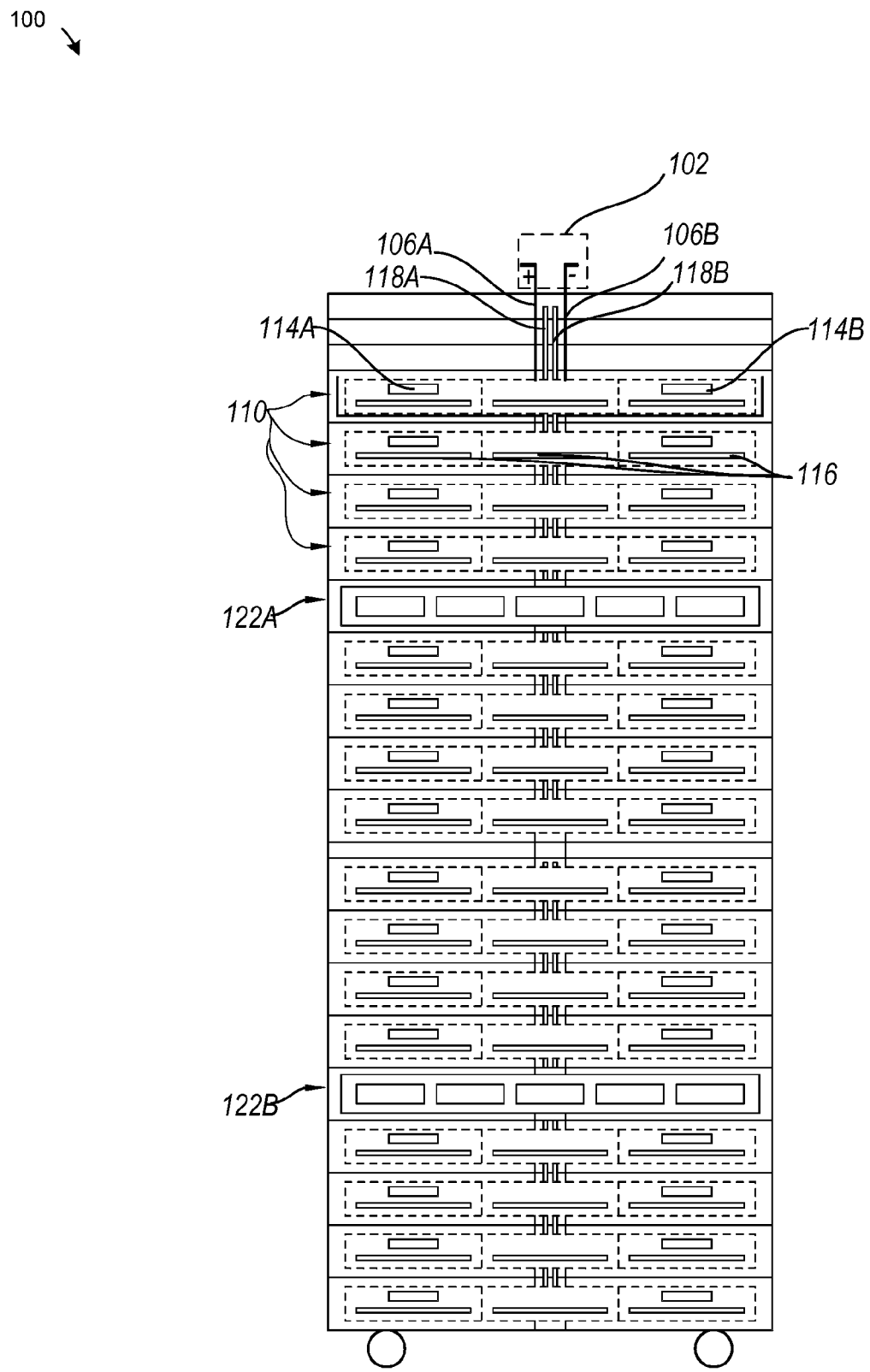
FIG. 1 is a block diagram illustrating an example of a server rack powered by high voltage direct current (HVDC), in accordance with various embodiments.

The figures depict various embodiments of the disclosure for purposes of illustration only. One skilled in the art will readily recognize from the following discussion that alternative embodiments of the structures and methods illustrated herein may be employed without departing from the principles of the invention described herein.

DETAILED DESCRIPTION

Embodiments include a server rack architecture that uses high voltage direct current (HVDC) instead of AC to supply power to computer servers in a server rack. In one example, the HVDC can be in 380V DC. In another example, the HVDC can be in the range of 250 VDC to 400 VDC. In yet another example, the HVDC can be in the range of 24 VDC to 800 VDC. The HVDC power can be provided by a HVDC power grid or a data center level AC-DC converter system (e.g., one or more AC-DC converters) outside of the server rack. For example, HVDC power can be provided throughout a server rack utilizing a HVDC power rail pair. The HVDC power rail pair can traverse or cross multiple IT equipment shelves within a power domain (e.g., a group of IT equipment shelves) of the server rack. In some embodiments, the server rack has a single power domain. In other embodiments, the server rack has multiple power domains for isolating potential effects of power equipment failure. The HVDC power is converted to IT-usable DC power (e.g., 12V or 12.5V) via DC-DC converters in the IT equipment shelves. An IT equipment shelf is a shelf that stores and powers one or more IT devices (e.g., device chassis, computer servers, network equipment, data storage devices, network appliances, or any combination thereof). For example, the IT equipment shelf can house multiple computer servers chassis (e.g., up to three). The IT-usable DC power generated by the DC-DC converters is shared amongst the IT equipment/devices installed in the IT equipment shelf and it is re-shared amongst all or a subset of the IT equipment shelves installed in the server rack via an IT power bus pair. The IT power bus pair can also traverse or cross the IT equipment shelves in the power domain.

The disclosed server rack architecture removes the need of using power shelves and thus is able to accommodate more IT equipment than usual as compared to the traditional server rack architectural layouts. For example, at least 2 Open Units (OU) of rack space can be saved and can be reallocated only to IT equipment shelves. An "OU" is a unit of rack space in accordance with the Open Rack standard of the Open Compute Project. Moreover, the disclosed server rack architecture provides cross-shelf power redundancy by sharing the IT-usable DC power from shelf to shelf utilizing the IT power bus pair. Because the DC-DC converters tend to be more inexpensive compared to more complex AC input power supply modules (e.g., multiple AC-DC converters), the disclosed server rack architecture also reduces the overall cost of the server rack. The disclosed server rack architecture can also greatly increase the level of power redundancy.

The disclosed HVDC power path experiences a lower conduction loss than the traditional AC to DC power path. For example, the traditional low voltage DC power path may experience a ~1.5% conduction loss in a rack at full load, while with the disclosed HVDC design, the low voltage DC power path may experience less than 0.3% of total conduction loss at full load. The disclosed server rack architecture has a higher number of small power converters (e.g., DC-DC converters) than the traditional server rack architecture (e.g., AC-DC converters). Because of this, when redundancy is lost, each traditional server rack architecture supports a lower maximum peak power (e.g., 13.2 kW of peak power) as compared to the disclosed server rack architecture (e.g., 22.5 kW of peak power). Because the disclosed server rack architecture integrates the DC-DC converters in the IT equipment shelves, shelves in a server rack under this architecture can include up to a maximum of 18 '2 OU' shelves with power conversion equipment, when an Open Compute Project Open Rack with 36 OU is used.

Turning now to the figures, FIG. 1 is a block diagram illustrating an example of a server rack 100 powered by high voltage direct current (HVDC), in accordance with various embodiments. The server rack 100 can be adapted with various form factors. In the illustrated example, the server rack 100 can be consistent with the Open Rack standard specify by the Open Compute Project. The Open Rack standard can specify modular height space by units of "OUs." In one example, the server rack 100 has a rack height up to 2110 mm or 83 inches.

The server rack 100 includes a rack power interface 102 adapted to receive high voltage direct current (HVDC) power from an external source. The rack power interface 102 can have an external connector adapted to couple with a positive terminal and a negative terminal of a cable electrically coupled to the external source. The rack power interface 102 can also couple to a ground terminal. The rack power interface 102 can also have an internal connector adapted to couple with a HVDC power rail pair comprising a positive voltage rail 106A and a negative voltage rail 106B (collectively as the "HVDC power rail pair 106"). The HVDC power rail pair 106 can distribute the HVDC power across a plurality of IT equipment shelves 110. For example, an IT equipment shelf can take up to two OUs of space in the server rack 100 according to the Open Rack standard.

For example, the IT equipment shelves 110 can each include one or more DC-DC converters (e.g., a DC-DC converter 114A, a DC-DC converter 114B, etc., collectively as the "DC-DC converters 114"). The DC-DC converters can be insulated and/or isolated DC-DC converters. Each of the DC-DC converters 114 is capable of converting the HVDC power to an IT-usable DC power with a DC voltage lower than the HVDC power. That is, the DC-DC converters 114 can be step down DC-DC converters. In one example, at least one of the DC-DC converters 114 is a 750 W DC-DC converter.

Each of the IT equipment shelves 110 can support a plurality of IT devices 116, for example computer motherboard chassis. The IT devices 116 commonly consume 12V nominal, or voltages lower than 60 VDC (safety extra-low voltage (SELV) threshold). The DC-DC converters 114 can convert DC electric power from the higher voltage (e.g., typically 250V to 400V) of the HVDC power from the HVDC power rail pair 106 to the lower IT-usable DC voltage (e.g., 12V or 12.5V). In some embodiments, the DC-DC converters 114 can still produce the IT-usable DC voltage that satisfies the power requirements of the IT devices 116 despite fluctuations in the HVDC power voltage (e.g., within a range of 250V to 440V).

The server rack 100 can also include an information technology (IT) power bus pair comprising a positive voltage bus 118A and a negative voltage bus 118B (collectively as the "IT power bus pair 118"). The IT power bus pair 118 is adapted to share redundant IT-usable DC power that has a lower voltage than the HVDC power. For example, the IT power bus pair 118 can be adapted to distribute and maintain an electric potential of substantially 12V or 12.5V (e.g., output voltage of the DC-DC converters that are electrically connected in parallel). The IT-usable DC power produced from the DC-DC converters 114 can support one or more electrical loads (e.g., the IT devices 116). The electrical loads can include one or more computing devices (e.g., computer servers), network equipment, one or more data storage devices, one or more cooling systems, other electrical components in the server rack 100, or any combination thereof. The IT-usable DC power can also be shared with other IT equipment shelves via the IT power bus pair 118. When the DC-DC converters 114 are not producing sufficient power (e.g., including complete failure) for electrical loads (e.g., the IT devices 116), the electrical loads can draw the redundant IT-usable DC power from the IT power bus pair.

The server rack 100 can include a backup power shelves (e.g., a backup power shelf 122A and a backup power shelf 122B, collectively as the "backup power shelves 122"). Each of the backup power shelves 122 can include one or more energy storage devices. Each of the backup power shelves 122 can also take up to two OUs worth of space in the server rack 100 according to the Open Rack standard. For example, each of the backup power shelves 122 can include one or more BBUs, one or more super capacitors, or a combination thereof. In some embodiments, the energy storage devices are adapted to be charged by the HVDC power (e.g., approximately 380V) from the HVDC power rail pair 106. The energy storage devices can be adapted to provide backup HVDC power via the HVDC power rail pair 106 when the rack power interface 102 fails to draw sufficient power for the server rack 100 from the external source.

In some embodiments, the energy storage devices are adapted to be charged by the redundant IT-usable DC power (e.g., approximately 12V) of the IT power bus pair 118. The energy storage devices can be adapted to provide backup IT-usable DC power via the IT power bus pair 118 when the IT-usable DC power provided by the DC-DC converters 114 drops substantially below a threshold (e.g., 12V).

In the illustrated example, the server rack 100 (e.g., an Open Rack) includes 16 IT equipment shelves 110. For example, each of the IT equipment shelves 110 can have a height of 20 U. Each of the IT equipment shelves 110 can include two DC-DC converters. In the illustrated example, the server rack 100 has 32 of the DC-DC converters 114, providing up to 22.5 kW of continuous or peak power even when redundancy is lost (e.g., each of the two isolated power zones in the rack left with 15 DC-DC modules instead of 16, because one of those failed respectively, 15×2×750 W=22.5 kW). Each of the IT equipment shelves 110 can include up to three IT equipment nodes (e.g., the IT devices 116). Accordingly, the server rack 100 can support up to 48 IT equipment nodes utilizing the DC-DC converters 114.

Figure 2:
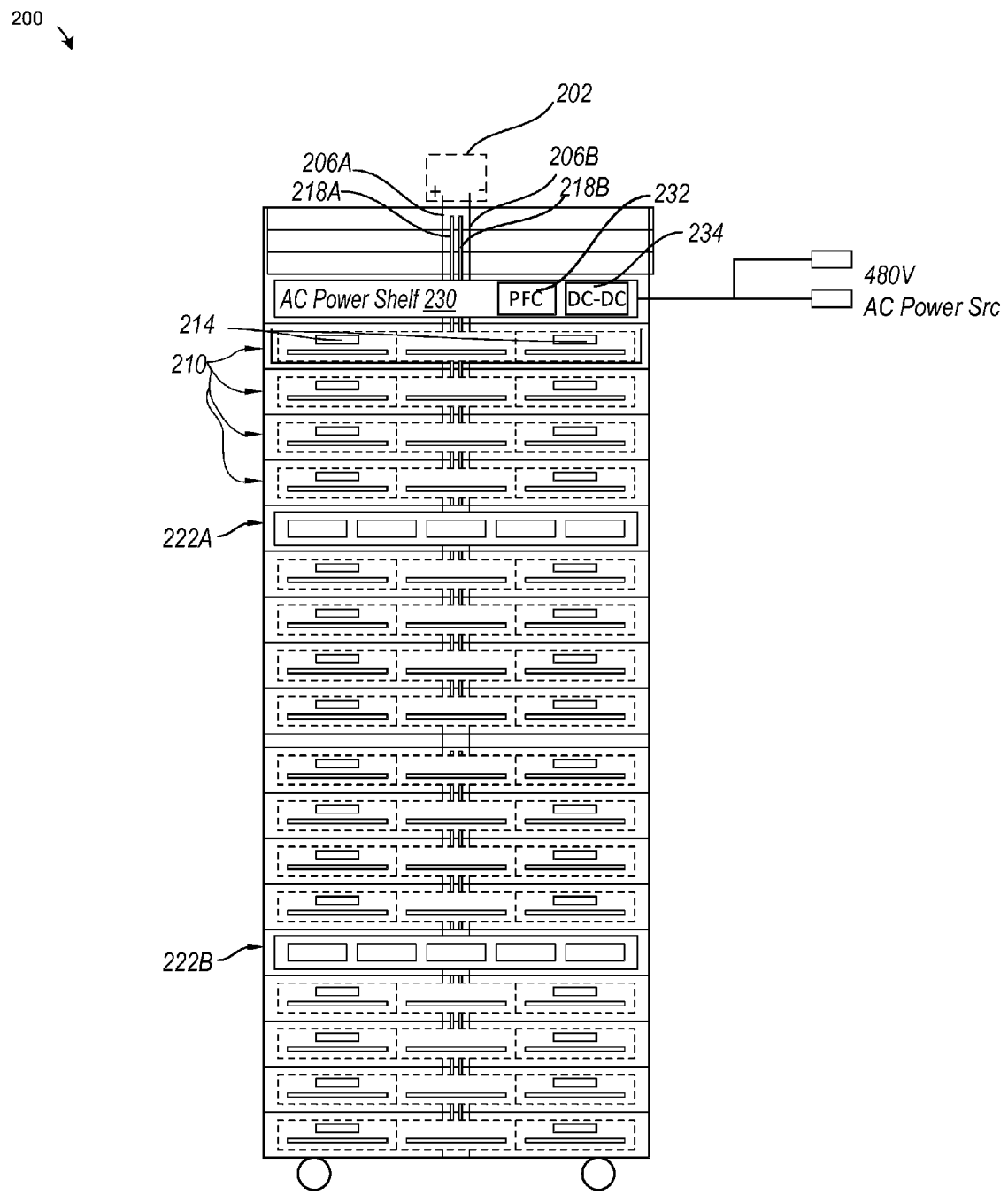
FIG. 2 is a block diagram illustrating another example of a server rack powered by high voltage direct current (HVDC) with an alternating current (AC) input for redundancy, in accordance with various embodiments.

FIG. 2 is a block diagram illustrating another example of a server rack 200 powered by HVDC with an alternating current (AC) input for redundancy, in accordance with various embodiments. The server rack 200 can include a rack power interface 202, HVDC power rail pair (e.g., a positive rail 206A and a negative rail 206B, collectively as the "HVDC power rail pair 206"), IT equipment shelves 210, DC-DC converters 214, IT power bus pair (e.g., a positive voltage bus 218A and a negative voltage bus 218B, collectively as the "IT power bus pair 218"), and backup power shelves (e.g., a backup power shelf 222A and a backup power shelf 222B, collectively as the "backup power shelves 222"). These components can be substantially similar to the rack power interface 102, the HVDC power rail pair 106, the IT equipment shelves 110, the DC-DC converters 114, the IT power bus pair 118, and the backup power shelves 122, respectively.

In the illustrated example, the server rack 200 includes 16 IT equipment shelves. Each of the IT equipment shelves 210 can include two DC-DC converters. In the illustrated example, the server rack 200 has a total of 32 of the DC-DC converters 214, providing up to 22.5 kW of continuous or peak power even when redundancy is lost. Each of the IT equipment shelves 210 can enclose and power up to three IT equipment nodes. Accordingly, the server rack 200 can support up to 48 IT equipment nodes utilizing the DC-DC converters 214.

In one example, the server rack 200 has a rack height up to 2210 mm or 87 inches. The server rack 200 differs from the server rack 100 in at least that the server rack 200 includes an AC power shelf 230 used to generate the HVDC when not available in the power distribution where the rack is deployed. The AC power shelf 230 can be coupled to an AC power grid (e.g., providing 480V of AC power). For example, the AC power shelf 230 can connect to the AC power grid via to two L22-20P AC power plugs. The AC power shelf 230 can include a power factor correction (PFC) module 232 and one or more DC-DC converter 234 used to generate an output DC voltage substantially lower than the usual HVDC level, for some applications. A bypass scheme with the input AC line can ensure the redundancy of the sole PFC module. This embodiment can be used when a server rack is coupled to a HVDC source, but the HVDC power may not be available in a data center.

The AC power shelf 230 is adapted to convert the AC power input from the AC power grid to HVDC power, usable then by the DC-DC modules 214. In embodiments where the AC power shelf 230 provides the backup IT-usable DC power, the AC power shelf 230 can distribute the backup IT-usable DC power via the IT power bus pair 218 when a critical number of the DC-DC converters 214 fail. In embodiments where the AC power shelf 230 provides the backup HVDC power, the AC power shelf 230 can distribute the backup HVDC power via the HVDC power rail pair 206 when the HVDC power drawn from the rack power interface 202 is no longer sufficient to support the electrical load of the server rack 200.

The PFC module 232 can include circuitry adapted to perform power correction on the AC power input. The AC-DC converter 234 can be adapted to convert the AC power input into the backup IT-usable DC power or the backup HVDC power. In several embodiments, the AC power shelf 230 includes a PFC bypass mechanism. For example, the AC power shelf 230 can be adapted to detect a failure of the PFC module 232 and switch the power conversion path such that the AC power input is converted into the backup IT-usable DC power or the backup HVDC power without the power factor correction.

Figure 3:
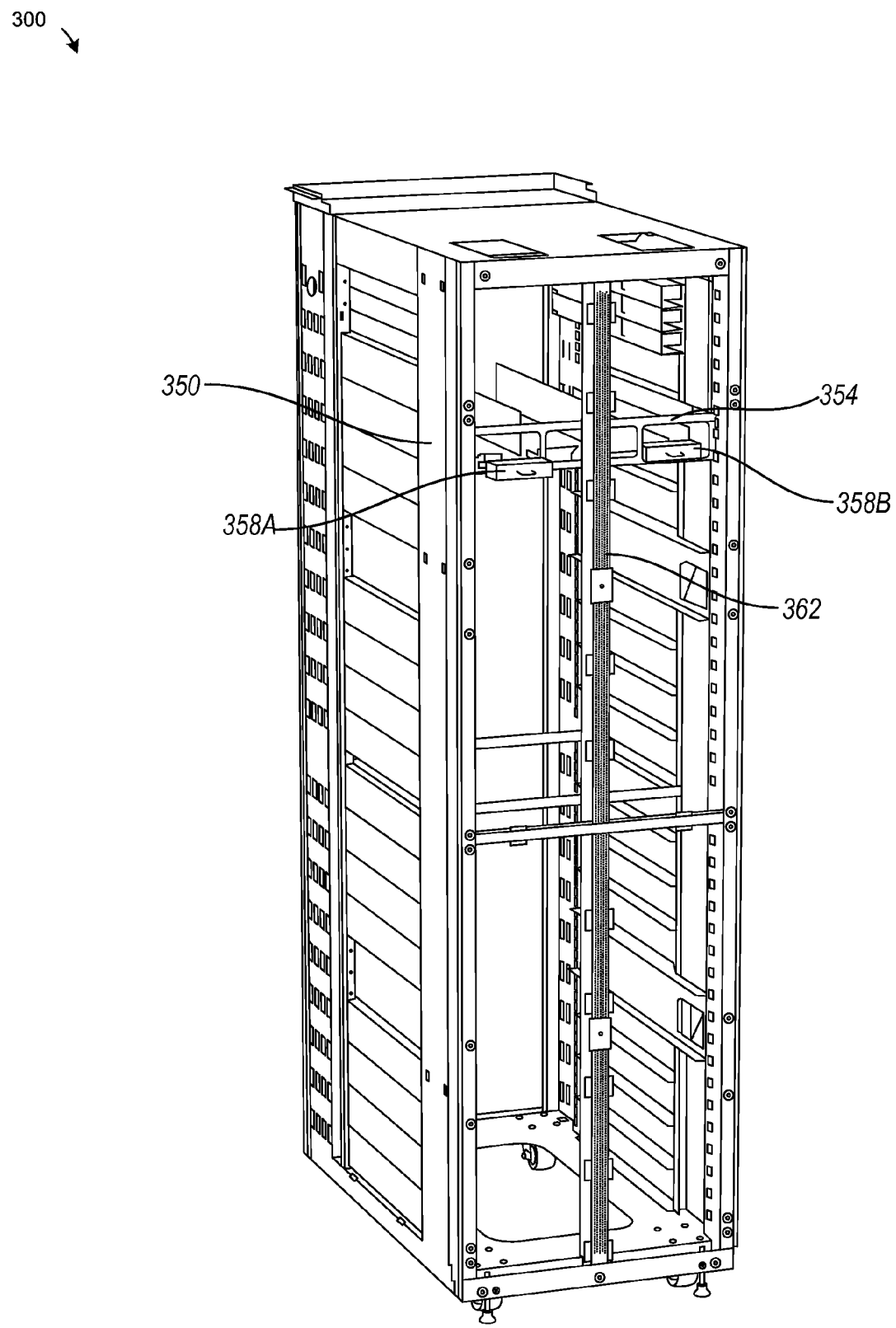
FIG. 3 is a perspective view of an example of a server rack with an IT equipment shelf inserted therein, in accordance with various embodiments.

FIG. 3 is a perspective view of an example of a server rack 300 with an IT equipment shelf inserted therein, in accordance with various embodiments. The server rack 300 can be the server rack 100 of FIG. 1 or the server rack 200 of FIG. 2. The server rack 300 can include a rack frame 350. The rack frame 350 can provide structural support for detachable components of the server rack 300. For example, the rack frame 350 can be adapted to receive and support at least a shelf chassis 354 (e.g., chassis for one of the IT equipment shelves 110 or the IT equipment shelves 210). The shelf chassis 354 can have the form factor of a metal tray. In the illustrated example, the server rack 300 can include slots to receive up to 16 shelf chassis.

In the illustrated example, the shelf chassis 354 is sectioned into three compartments, each capable of fitting at least an IT device (e.g., computing server) and/or a computing accessory (e.g., network card, data storage module, cooling module, etc.). The shelf chassis 354 can expose DC-DC converters (e.g., a DC-DC converter 358A and a DC-DC converter 358B, collectively as the "DC-DC converters 358"). Each of the DC-DC converters 358 can include a handle, and can be a blind-mating capable and hot-swappable module.

The rack frame 350 can include a frame spine 362. A frame spine 362 can traverse vertically through the server rack 300 crossing over multiple slots for the shelf chassis. The frame spine 362 can provide support for power distribution conductors (e.g., the HVDC power rail pair 106 and/or the IT power bus pair 118) of the server rack 300 (e.g., one or more bus-bar systems and/or rail systems).

Figure 4:
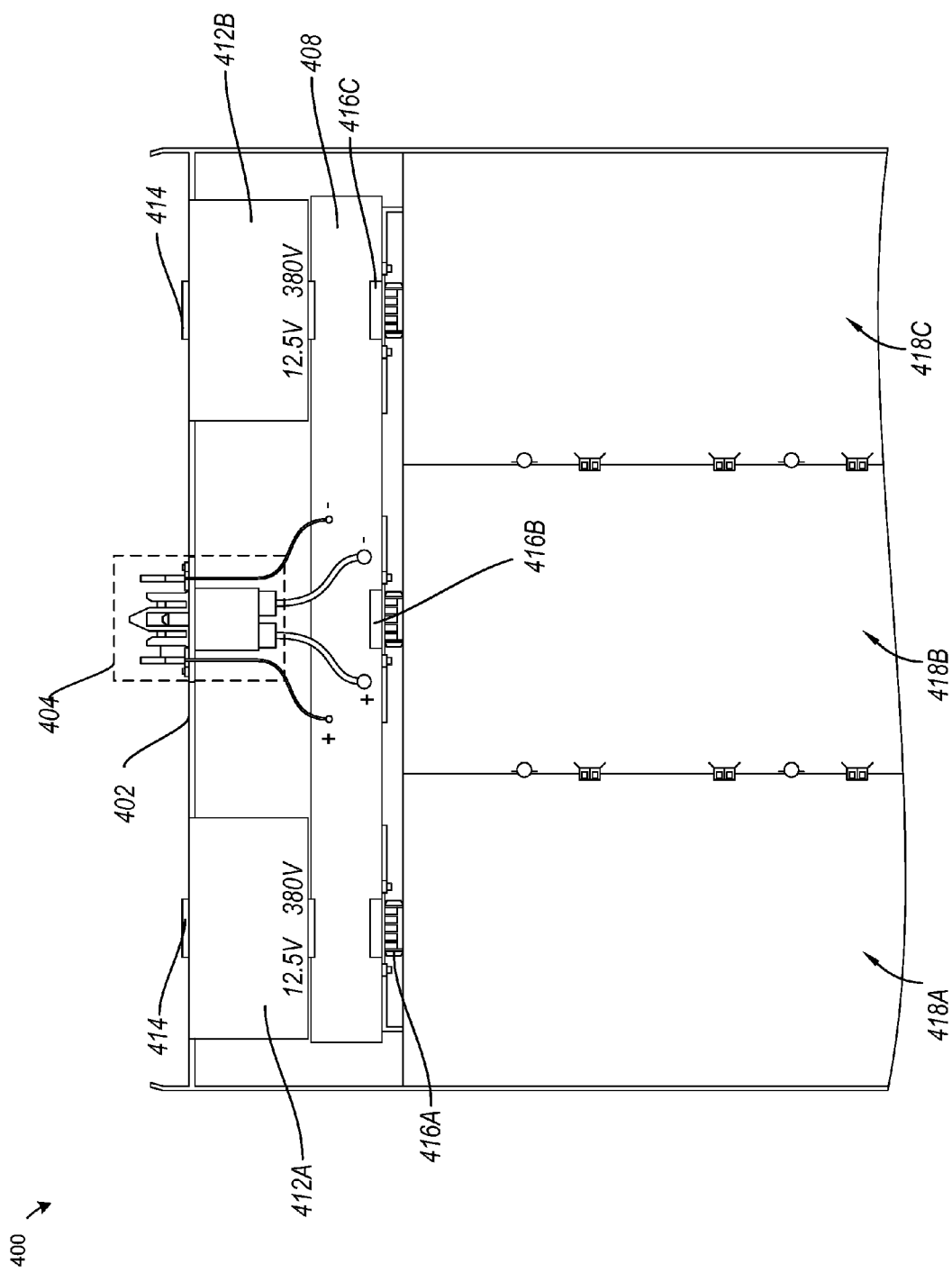
FIG. 4 is a top view of an example of an IT equipment shelf, in accordance with various embodiments.

FIG. 4 is a block diagram illustrating an example of an IT equipment shelf 400, in accordance with various embodiments. The IT equipment shelf 400 can include a rear panel 402. An external power connector 404 can be exposed through the rear panel 402. In some embodiments, IT devices can be installed on the opposite side of the rear panel 402. The external power connector 404 can be adapted to access HVDC power from a power rail pair (e.g., the HVDC power rail pair 106) traversing or crossing IT equipment shelves in a server rack (e.g., the server rack 100, the server rack 200, and/or the server rack 300). The external power connector 404 can further be adapted to access backup IT-usable DC power from an IT power bus pair (e.g., the IT power bus pair 118) traversing or crossing the IT equipment shelves in the server rack.

The IT equipment shelf 400 can include a power distribution board 408 (e.g., a printed circuit board (PCB)). The power distribution board 408 can be electrically coupled to the external power connector 404, enabling the power distribution board 408 to access the HVDC power. For example, the external power connector 404 can include a positive HVDC terminal and a negative HVDC terminal corresponding to a positive HVDC terminal and a negative HVDC terminal on the power distribution board 408. The external power connector 404 can include a positive IT-usable terminal and a negative IT-usable terminal corresponding to a positive IT-usable terminal and a negative IT-usable terminal on the power distribution board 408 (e.g., 12V or a voltage always lower than 60 VDC SELV threshold).

The IT equipment shelf 400 can include a step down DC-DC converter 412A and a step down DC-DC converter 412B (collectively as the "step down DC-DC converters 412"), both electrically coupled to the power distribution board 408. The step down DC-DC converters 412 can be adapted to convert the HVDC power to an IT-usable DC power at a lower voltage compared to the HVDC power. The step down DC-DC converters 412 can be hot pluggable/hot swappable through the rear panel 402 to the power distribution board 408. The step down DC-DC converters 412 can include output OR-ing circuitry for redundancy. That is, when one of the step down DC-DC converters 412 is removed from or coupled to the power distribution board 408, the IT devices of the IT equipment shelf 400 can continue to function without interruption. The step down DC-DC converters 412 can blindly mate with the power distribution board 408. In some embodiments, each of the step down DC-DC converters 412 includes a handle 414. The handle 414 enables an IT personnel to remove a failed step down DC-DC converter easily. The IT personnel can then insert a new step down DC-DC converter through an opening in the rear panel 402 to couple with the power distribution board 408.

The power distribution board 408 can include IT power distribution connectors (e.g., an IT power distribution connector 416A, an IT power distribution connector 416B, and an IT power distribution connector 416C, collectively as the "IT power distribution connectors 416"). The IT power distribution connectors 416 can be panel-mount connectors (e.g., floating connectors). Connectors on the power distribution board 408 can be board-mount connectors. Each of the IT power distribution connectors 416 can electrically couple the power distribution board 408 to one or more IT devices (not shown). Each of the IT power distribution connectors 416 can be adapted to provide the IT-usable DC power to an IT device in an IT tray of the IT equipment shelf 400. In the illustrated example, the IT equipment shelf 400 can include three IT tray slots (e.g., an IT tray slot 418A, an IT tray slot 418B, and an IT tray slot 418C, collectively as the "IT tray slots 418"). The IT tray slots 418 can accept IT devices. Each of the IT power distribution connectors 416, for example, can provide 12V of DC power to the corresponding IT device in the corresponding IT tray slot. For example, the IT device can draw an average of 300 W or a peak of 500 W from its corresponding IT power distribution connector.

The power distribution board 408 can be adapted to share the IT-usable DC power provided by the step down DC-DC converters 114 back to the IT power bus pair via the external power connector 404, for example back to an open rack bus bar. This sharing of the IT-usable DC power enables the server rack to have cross-shelf power redundancy. The cross-shelf power redundancy ensures that an IT equipment node is agnostic of where it is drawing its power. For example, the power distribution board 408 can be adapted to draw the backup IT-usable DC power when the step down DC-DC converters 412 fails.

Figure 5:
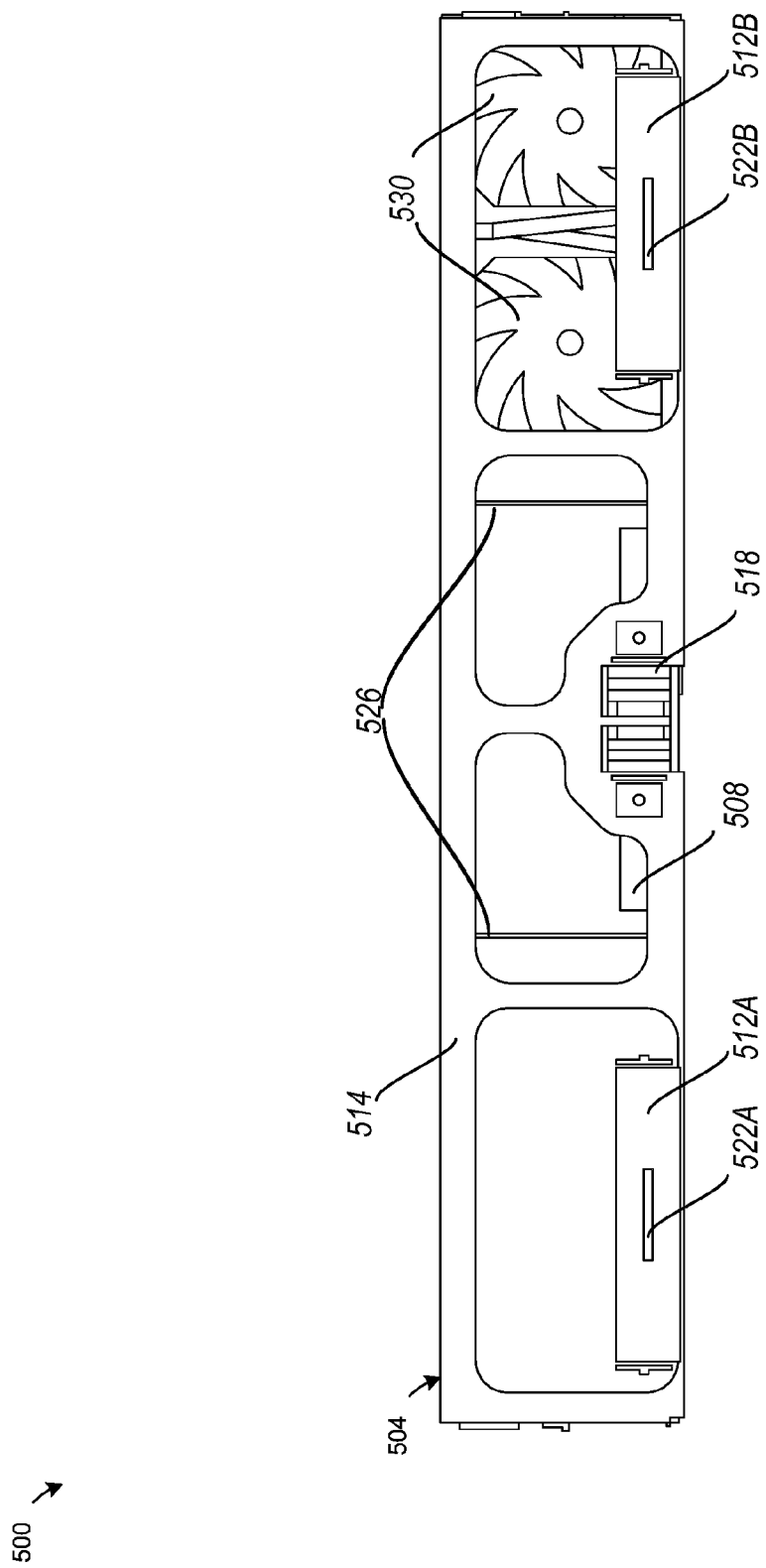
FIG. 5 is a rear view of another example of an IT equipment shelf, in accordance with various embodiments.

FIG. 5 is a rear view of another example of an IT equipment shelf 500, in accordance with various embodiments. The IT equipment shelf 500 can be the IT equipment shelf 400 of FIG. 4. The IT equipment shelf 500 is protected by an enclosure shell 504 that provides support for components therein. The enclosure shell 504 can at least partially enclose a power distribution board 508 (e.g., the power distribution board 408) and DC-DC converters (e.g., a DC-DC converter 512A and a DC-DC converter 512B, collectively as the "DC-DC converters 512"). A rear panel 514 (e.g., the rear panel 402) of the enclosure shell 504 can include openings that partially expose an external power connector 518 (e.g., the external power connector 404) and the DC-DC converters 512 (e.g., the step down DC-DC converters 412). The external power connector 518 can be a clip. In some embodiments, handles 522 (e.g., a handle 522A and a handle 522B, collectively as the "handles 522") of the DC-DC converters 512 can protrude away from the enclosure shell 504. Likewise, a portion of the external power connector 518 can also protrude away from the enclosure shell 504.

Internal division walls 526 can form a plurality of slots for insertion of one or more IT devices. For example, the slots can enable the cooling airflow to pass through with highest opening area possible. The power distribution board 508 can extend across the width of the rear panel 514 to pass through the plurality of slots. For example, a portion of the power distribution board 508 can extend behind the DC-DC converters 512. The power distribution board 508 can have detachable power connection interfaces to connect with the DC-DC converters 512. The handles 522 can be adapted to enable a person to non-violently disengage the DC-DC converters 512 from the power distribution board 508. The number of the plurality of slots can be equal to the number of IT power distribution connectors attached to the power distribution board 508.

In some embodiments, one or more fans 530 can be powered by the power distribution board 508. The fans 530 can draw IT-usable DC power from the power distribution board 508. The fans 530 can move air that carries the heat generated by the IT devices away and out through the openings at the rear panel 514. The movement of air can also carry away the heat generated by the DC-DC converters 512 out through the openings at the rear panel 514. In some embodiments, the fans 530 are cooling fans of the IT device. In some embodiments, the fans 530 are separate fans installed in the rear of the server rack (e.g., a rack fan wall).

Figure 6:
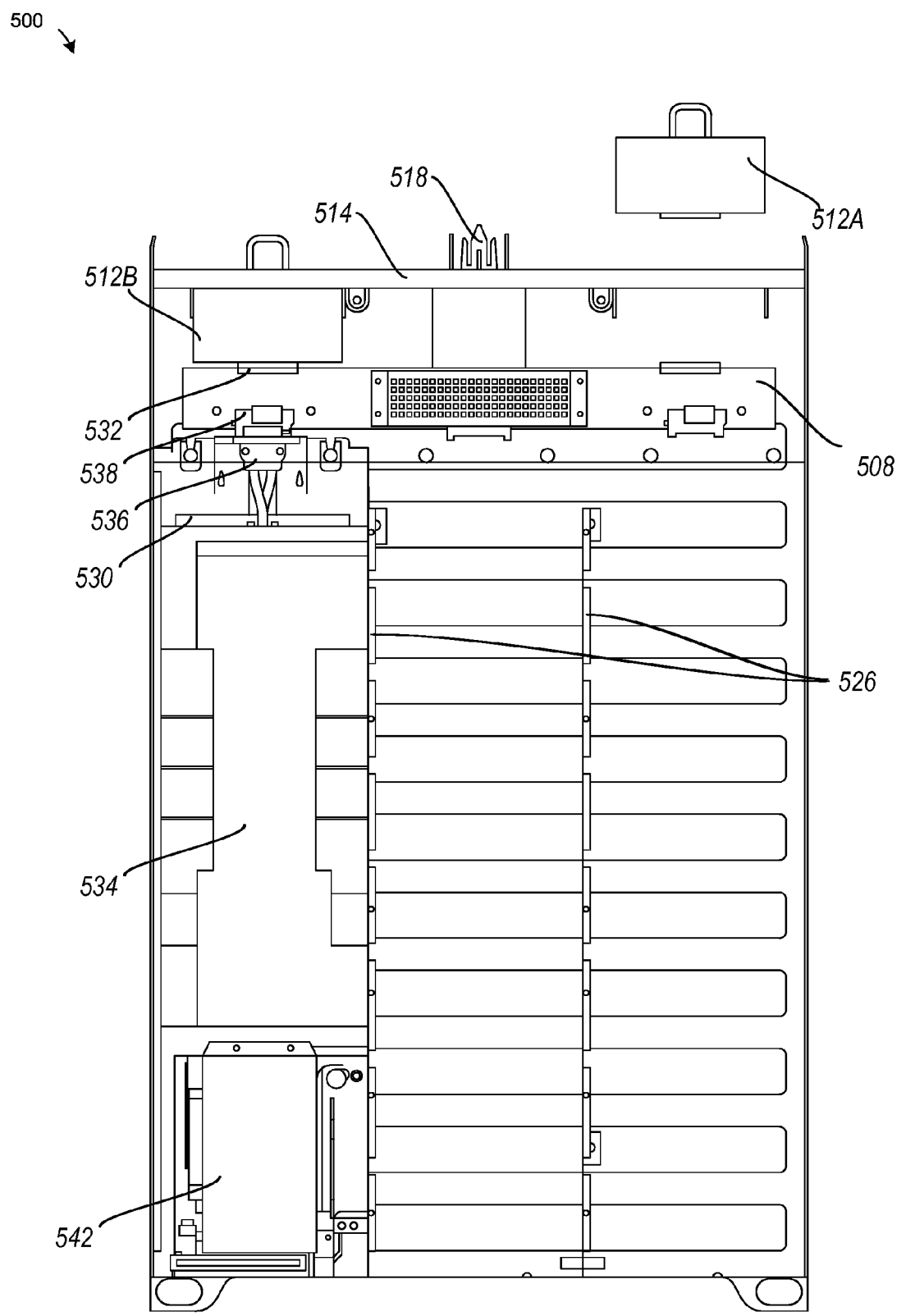
FIG. 6 is a top view of the IT equipment shelf of FIG. 5 with one of the DC-DC converters removed, in accordance with various embodiments.

FIG. 6 is a top view of the IT equipment shelf 500 of FIG. 5 with one of the DC-DC converters 512 removed, in accordance with various embodiments. FIG. 6 illustrates one IT device (e.g., a gear, a chassis, or a motherboard) is installed to the left tray slot. For example, up to three IT devices can be installed in the IT equipment shelf 500). The illustrated top view shows the DC-DC converter 512B plugged into the power distribution board 508 through an opening of the rear panel 514 and the DC-DC converter 512A pulled out from another opening of the rear panel 514. The DC-DC converter 512B can be plugged into a converter connector interface 532 of the power distribution board 508. The converter connector interface 532 can be a hot swappable interface capable of blind mating with the DC-DC converter 512B. In some embodiments, the converter connector interface 532 can release the DC-DC converter 512A when the handle 522B experiences a pulling force. The external power connector 518 is exposed through an opening in the rear panel 514. A flat power bus of the external power connector 518 is shown to connect with the power distribution board 508.

The enclosure shell 504 is shown to be divided into three slots by the internal division walls 526. The power distribution board 508 is shown to span across all three slots. The illustrated top view shows one of the slots occupied by a computing device 534. The computing device 534 includes a power bus interface 536 (e.g., panel-mount floating connector) that plugs into an IT power distribution connector 538 (e.g., board-mount mating connector) of the power distribution board 508.

In some embodiments, the fans 530 are part of the computing device 534. In some embodiments, the fans 530 are stand-alone components of the IT equipment shelf 500 or a server rack (e.g., the server rack 100 or the server rack 200). An accessory component 542 is shown to be coupled to the computing device 534. The accessory component 542 can be a network card, a memory storage, a heat management device, a graphics card, or any combination thereof.

Figure 7:
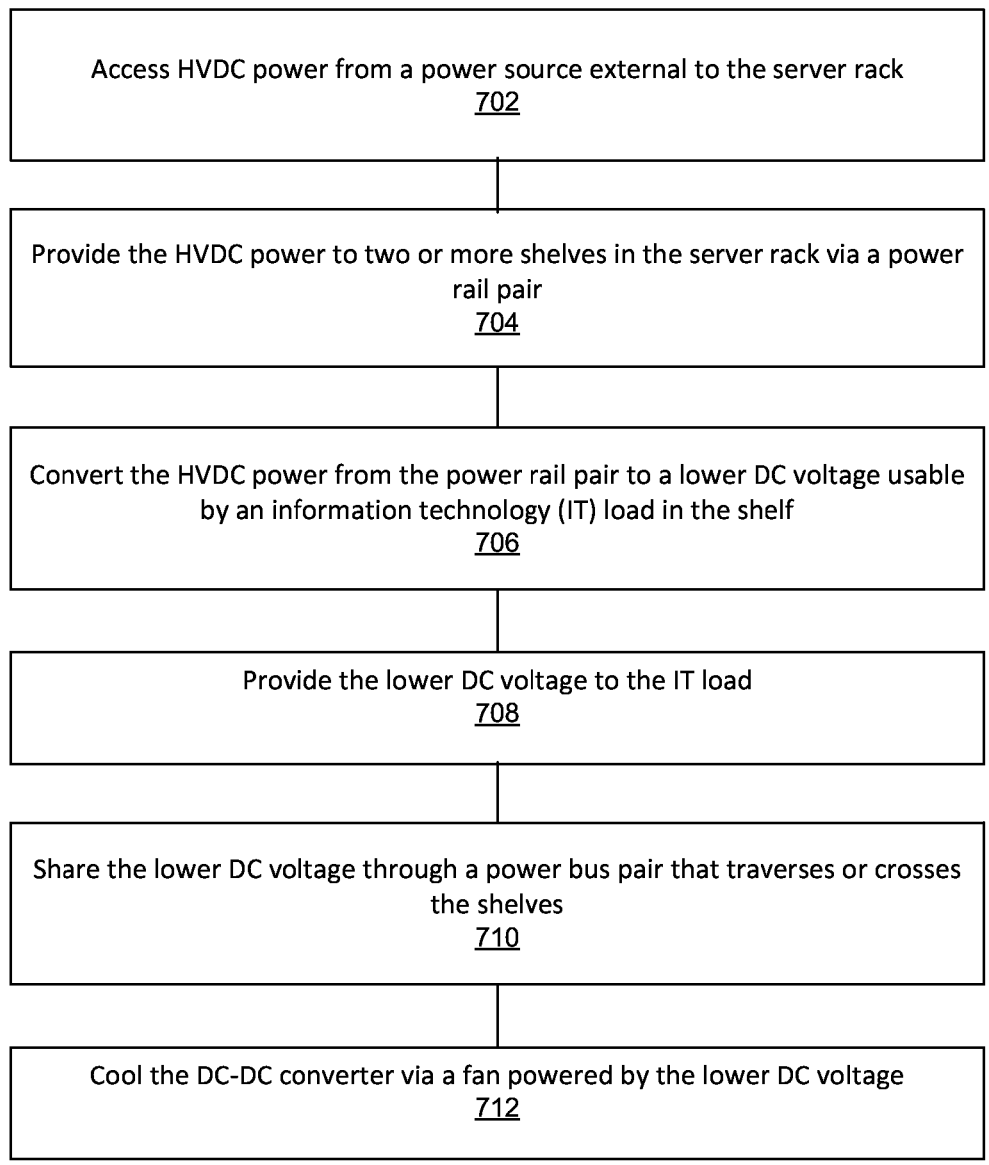
FIG. 7 is a flow chart of a method of operating a power system of a server rack having at least an IT equipment shelf, in accordance with various embodiments.

FIG. 7 is a flow chart of a method 700 of operating a power system of a server rack having at least an IT equipment shelf, in accordance with various embodiments. At step 702, a rack power interface of the server rack can access HVDC power from a power source external to the server rack. The power source can be a HVDC power grid or an AC-DC converter that draws power from an AC power grid.

At step 704, a HVDC power rail pair can provide the HVDC power to two or more shelves in the server rack. At step 706, a DC-DC converter in each of the shelves can convert the HVDC power from the power rail pair to a lower DC voltage usable by an information technology (IT) load in the shelf. The lower DC voltage can be a 12V DC or a voltage lower than 60V DC. At step 708, a power distribution board of the shelf can provide the lower DC voltage to the IT load. At step 710, the power distribution board can share the lower DC voltage with the other shelves through an IT power bus pair that traverses or crosses the shelves. At step 712, the shelf can cool the DC-DC converter via a fan powered by the lower DC voltage.

While processes or methods are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. In addition, while processes or blocks are at times shown as being performed in series, these processes or blocks may instead be performed in parallel, or may be performed at different times.

Some embodiments of the disclosure have other aspects, elements, features, and steps in addition to or in place of what is described above. These potential additions and replacements are described throughout the rest of the specification. Reference in this specification to "various embodiments" or "some embodiments" means that a particular feature, structure, or characteristic described in connection with the embodiment is included in at least one embodiment of the disclosure. Alternative embodiments (e.g., referenced as "other embodiments") are not mutually exclusive of other embodiments. Moreover, various features are described which may be exhibited by some embodiments and not by others. Similarly, various requirements are described which may be requirements for some embodiments but not other embodiments.

What is claimed is:

1. A method, comprising:
   accessing high voltage direct current (HVDC) power from a power source external to a server rack;
   providing the HVDC power to two or more shelves in the server rack via at least a power rail pair, wherein the power rail pair crosses or traverses through the shelves;
   converting, via a direct current to direct current (DC-DC) converter in a shelf, the HVDC power from the power rail pair to a lower DC voltage usable by information technology (IT) load in the shelf; and
   providing the lower DC voltage to the IT load.

2. The method of claim 1, wherein the lower DC voltage is a 12V DC voltage.

3. The method of claim 1, wherein power source is a HVDC power grid or an alternating current (AC)-DC converter that draws power from an AC power grid.

4. The method of claim 1, further comprising cooling the DC-DC converter via a fan powered by the lower DC voltage.

5. A shelf adapted to fit in a server rack, comprising:
   an external power connector adapted to access high voltage direct current (HVDC) power from a power rail pair traversing or crossing shelves in the server rack;
   a power distribution board electrically coupled to the external power connector;
   a step down direct current to direct current (DC-DC) converter electrically coupled to the power distribution board and adapted to convert the HVDC power to a lower DC voltage usable by information technology (IT) load; and
   an IT power connector electrically coupled to the power distribution board and adapted to provide the lower DC voltage to an IT device in the shelf.

6. The shelf of claim 5, wherein the external power connector is adapted to further electrically connect with an IT power bus pair traversing or crossing shelves in the server rack; and wherein the power distribution board is adapted to draw backup IT-usable DC power and supply the IT-usable DC power to the IT device when the step down DC-DC converter fails.

7. The shelf of claim 6, wherein the power distribution board is adapted to provide the lower DC voltage from the step down DC-DC converter to the IT power bus pair to provide cross-shelf power redundancy.

8. The shelf of claim 5, wherein the power distribution board is adapted to electrically couple to multiple step down DC-DC converters in multiple slots for IT devices in the shelf.

9. The shelf of claim 5, wherein the power distribution board is adapted to electrically couple to multiple IT power distribution connectors.

10. The shelf of claim 5, further comprising an enclosure shell that at least partially encloses the power distribution board and the step down DC-DC converter and at least partially exposes the external power connector.

11. The shelf of claim 10, wherein the step down DC-DC converter is exposed through an opening on a panel of the enclosure shell.

12. The shelf of claim 5, wherein the power distribution board has a detachable power connection interface for the step down DC-DC converter to connect with; and wherein the step down DC-DC converter includes a handle adapted to enable a person to non-violently disengage the step down DC-DC converter from the power distribution board.

13. The shelf of claim 5, further comprising one or more internal division walls that form a plurality of slots for insertion of one or more IT devices; and wherein the number of the plurality of slots is equal to the number of IT power distribution connectors attached to the power distribution board.

14. A server rack, comprising:
   a rack power interface adapted to receive high voltage direct current (HVDC) power from an external source;
   a HVDC power rail pair comprising a positive voltage rail and a negative voltage rail and electrically coupled to the rack power interface to distribute the HVDC power;
   an information technology (IT) power bus pair comprising a positive voltage bus and a negative voltage bus, wherein the IT power bus pair is adapted to share redundant IT-usable DC power across IT equipment shelves, and wherein the redundant IT-usable DC power has a lower voltage than the HVDC power; and
   a rack frame adapted to receive at least an IT equipment shelf, wherein the rack frame includes a frame spine attached to the HVDC power rail pair and the IT power bus pair.

15. The server rack of claim 14, further comprising a backup power shelf that comprises one or more battery backup units (BBUs), one or more super capacitors, or any combination thereof.

16. The server rack of claim 15, wherein the BBUs, the super capacitors, or both, are adapted to be charged by the HVDC power from the HVDC power rail pair and are adapted to provide backup HVDC power via the HVDC power rail pair when the external source fails to provide sufficient power for the server rack.

17. The server rack of claim 15, wherein the BBUs, the super capacitors, or both, are adapted to be charged by the redundant IT-usable DC power from the IT power bus pair and are adapted to provide backup IT-usable DC power via the IT power bus pair to the IT equipment shelf when the IT equipment shelf fails to convert sufficient power for one or more IT devices in the IT equipment shelf.

18. The server rack of claim 14, further comprising an alternating current (AC) redundancy power shelf adapted to convert an AC power input to backup IT-usable DC power and to distribute the backup IT-usable DC power via the IT power bus pair when the IT-usable DC power provided by the external source is no longer sufficient for electrical load of the server rack.

19. The server rack of claim 18, wherein the AC redundancy power shelf comprises:
   a power factor correction (PFC) circuit adapted to perform power correction on the AC power input; and an AC-to-DC converter adapted to convert the AC power input into the backup IT-usable DC power.

20. The server rack of claim 19, wherein the AC redundancy power shelf is adapted to detect a failure of the PFC circuit and convert the AC power input into the backup IT-usable DC power without the power correction provided by the PFC circuit.

* * * * *